(12) United States Patent
Kundner et al.

(10) Patent No.: US 7,884,607 B2
(45) Date of Patent: Feb. 8, 2011

(54) MAGNETIC RESONANCE LOCAL COIL, PATIENT BED, AND IMAGING APPARATUS, WITH VIBRATION DAMPING

(75) Inventors: Thomas Kundner, Buckenhof (DE); Rainer Kurth, Erlangen (DE)

(73) Assignee: Siemens Aktiengesellschaft, Munich (DE)

(*) Notice: Subject to any disclaimer, the term of this patent is extended or adjusted under 35 U.S.C. 154(b) by 328 days.

(21) Appl. No.: 12/062,625

(22) Filed: Apr. 4, 2008

(65) Prior Publication Data

US 2008/0246479 A1 Oct. 9, 2008

(30) Foreign Application Priority Data

Apr. 4, 2007 (DE) .............. 10 2007 016 314

(51) Int. Cl.
*G01V 3/00* (2006.01)

(52) U.S. Cl. .............. 324/318

(58) Field of Classification Search ......... 324/300–322; 5/601; 600/407–423; 333/219–235
See application file for complete search history.

(56) References Cited

U.S. PATENT DOCUMENTS

| 2,112,092 | A | * | 3/1938 | Harrison | 200/33 A |
| 2,439,388 | A | * | 4/1948 | Hansen | 324/76.51 |
| 2,950,453 | A | * | 8/1960 | Kline et al. | 333/233 |
| 2,995,698 | A | * | 8/1961 | Collins | 324/314 |
| 3,093,804 | A | * | 6/1963 | Larue | 333/232 |
| 3,112,550 | A | * | 12/1963 | Bentley | 28/295 |
| 3,191,132 | A | * | 6/1965 | Mayer | 333/184 |
| 3,411,070 | A | * | 11/1968 | Anderson | 324/301 |
| 4,944,501 | A | * | 7/1990 | Sireul et al. | 5/601 |
| 5,066,915 | A |   | 11/1991 | Omori et al. | 324/318 |
| 5,197,474 | A | * | 3/1993 | Englund et al. | 600/415 |
| 5,764,059 | A | * | 6/1998 | Mansfield et al. | 324/318 |
| 5,783,943 | A | * | 7/1998 | Mastandrea et al. | 324/318 |
| 6,011,393 | A | * | 1/2000 | Kaufman et al. | 324/318 |
| 6,043,653 | A | * | 3/2000 | Takamori et al. | 324/309 |
| 6,414,489 | B1 | * | 7/2002 | Dean et al. | 324/318 |
| 6,529,004 | B1 | * | 3/2003 | Young | 324/318 |
| 6,564,900 | B1 | * | 5/2003 | Dean et al. | 181/202 |
| 6,794,871 | B2 | * | 9/2004 | Imai et al. | 324/318 |
| 7,009,397 | B2 | * | 3/2006 | Schuster et al. | 324/318 |
| 7,671,593 | B2 | * | 3/2010 | Goldhaber et al. | 324/318 |
| 2003/0062898 | A1 | * | 4/2003 | Imai et al. | 324/318 |
| 2003/0080742 | A1 | * | 5/2003 | Stofiel | 324/322 |
| 2003/0088172 | A1 | * | 5/2003 | Kuth | 600/407 |
| 2003/0196852 | A1 | * | 10/2003 | Dean et al. | 181/202 |
| 2003/0204136 | A1 |   | 10/2003 | Green et al. | 600/415 |
| 2004/0075437 | A1 |   | 4/2004 | Srinivasan | 324/318 |
| 2006/0147492 | A1 | * | 7/2006 | Hunter et al. | 424/426 |
| 2007/0290686 | A1 | * | 12/2007 | Goldhaber et al. | 324/318 |
| 2008/0246479 | A1 | * | 10/2008 | Kundner et al. | 324/318 |

* cited by examiner

*Primary Examiner*—Melissa J Koval
*Assistant Examiner*—Tiffany A Fetzner
(74) *Attorney, Agent, or Firm*—Schiff Hardin LLP

(57) ABSTRACT

A local coil arrangement for magnetic resonance imaging has a number of supporting connection devices for placement of the local coil arrangement on a patient bed, with each supporting connection device embodying a vibration damping device.

31 Claims, 5 Drawing Sheets

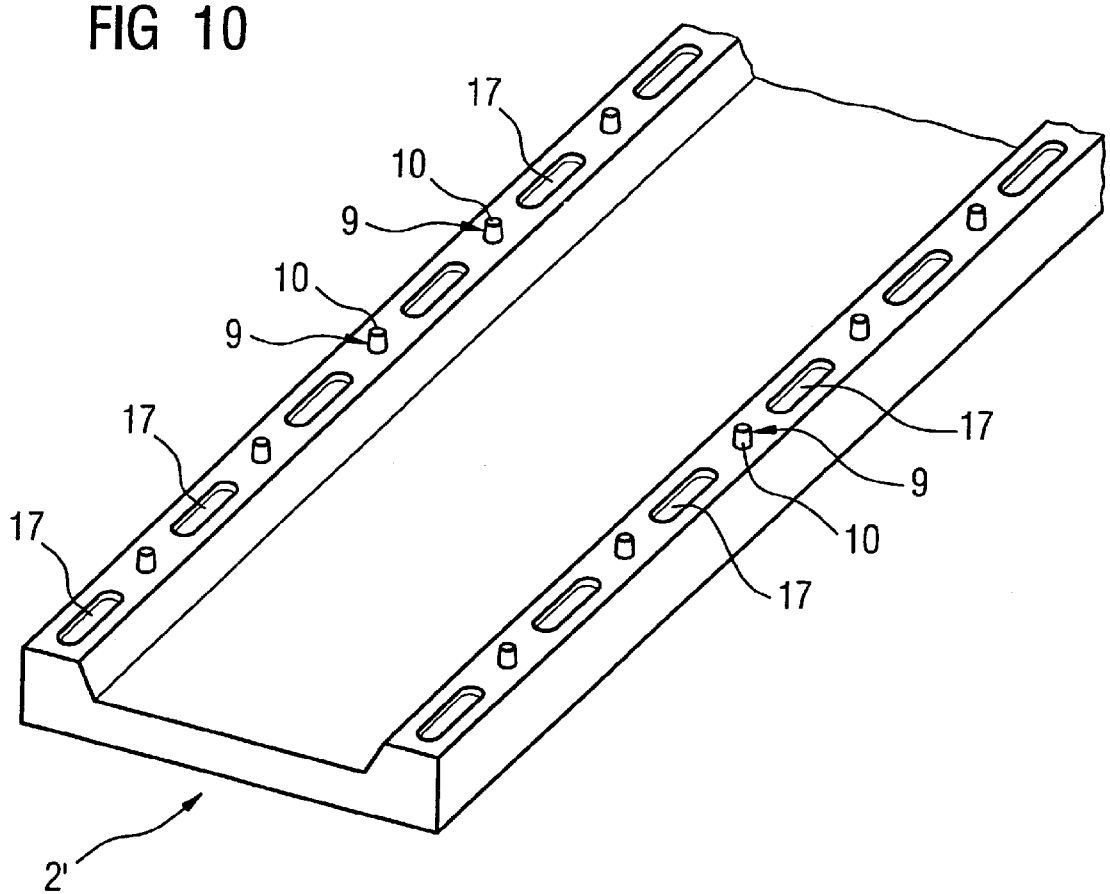

MAGNETIC RESONANCE LOCAL COIL, PATIENT BED, AND IMAGING APPARATUS, WITH VIBRATION DAMPING

BACKGROUND OF THE INVENTION

1. Field of the Invention

The invention concerns a local coil arrangement of the type having a number of supporting connection devices for placement of the local coil arrangement on a patient bed, as well as a patient bed for a magnetic resonance apparatus having a number of supporting connection devices for accepting a local coil arrangement, and a magnetic resonance apparatus embodying such a local coil arrangement or patient bed.

2. Description of the Prior Art

Movement or vibration artifacts frequently occur in the acquisition of magnetic resonance images. Causes for these movements are the inherent movements of the patient and/or vibrations of the magnetic resonance apparatus, for example of the gradient coils.

The vibration artifacts in local coils have predominantly been due to the movement of the patient, but solutions have been proposed to minimize this movement. A new type of vibration artifacts that are caused by coil vibrations occurs due to the recent development of multi-channel coils with a small measurement range that can be used in various patient positionings. These vibration artifacts lead to an impairment in the image quality.

An example of such a system in which such vibration artifacts occur due to coil vibrations is a patient bed with an attached local coil for acquisition of a wrist image, for example. For this purpose, the patient is positioned on the patient bed and extends his or her arm forwards with the hand and the wrist being inserted into the local coil. Image artifacts due to coil vibration in particular occur given such specifics of a case.

DE 40 20 477 A1 describes an RF coil positioning device for an imaging magnetic resonance system in which a bed mounted on a frame is driven by a drive mechanism such that an RF coil unit mounted on the bed can be moved into an imaging position. The RF coil unit is mounted in a fixed manner on a coil base that exhibits laterally projecting engagement projections that engage in corresponding receptacles provided at the bed.

U.S. Patent Application Publication No. 2003/0204136 describes an attachment possibility for a local coil on a patient support that also offers a secure fixing when the patient support is moved into a vertical position. A mounting with protruding fastening segments serves for this, which fastening segments can be inserted into corresponding holes of the patient receptacle to affix the local coil.

A local coil for use in an incubator that possesses rubber supports for secure fixing is known from U.S. Patent Application Publication No. 2004/0075437.

SUMMARY OF THE INVENTION

An object of the present invention is to provide for placement of a local coil on a patient bed with which a better image quality is achieved due to the reduction of vibration artifacts.

This object is provided in accordance with the invention by local coil arrangement of the aforementioned type wherein every supporting connection device includes a vibration damping device.

The basis of the invention is accordingly to damp vibrations where they are transferred, namely at the supporting connection devices of the placement device. In this manner the local coil arrangement (which can include one local coil but also multiple local coils) is advantageously largely mechanically decoupled from the patient bed, such that image artifacts due to vibrations of the local coil arrangement (and thus of the local coils) are reduced. A significant improvement of the image quality can be achieved with this approach.

In a further embodiment of the invention, the vibration damping device can comprise an elastic foot for bearing the local coil arrangement. In particular the entire load of the local coil arrangement can be supported on the elastic foot in this manner. Since this is elastic, the patient bed can be moved by small distances relative to the local coil arrangement, which movements are absorbed by the elastic foot, which correspondingly deforms such that the majority of the amplitude of a vibration is absorbed by the deformation of the elastic foot and is not transferred to the local coil arrangement. The material properties of the foot are too be selected such that as optimal a decoupling as possible is achieved. For example, a Shore hardness of Shore 30A has proven to be advantageous. The present invention is therefore based on the object to specify a possibility for placement of a local coil on a patient bed with which a better image quality is achieved via the reduction of vibration artifacts.

To achieve this object in a local coil arrangement of the aforementioned type, in accordance with the invention each supporting connection device embodies a vibration damping device.

The basis of the invention, as noted above, is to damp vibrations where they are transferred, namely at the supporting connection devices of the placement device. In this manner the local coil arrangement (which can include one local coil, but also multiple local coils) is advantageously largely mechanically decoupled from the patient bed, such that image artifacts due to vibrations of the local coil arrangement (and thus of the local coils) are reduced. A significant improvement of the image quality can be achieved with this approach.

In a further embodiment of the invention, the vibration damping device can be an elastic foot for supporting the local coil arrangement. In particular the entire load of the local coil arrangement can be supported on the elastic foot in this manner. Since this is elastic, the patient bed can be moved by small distances relative to the local coil arrangement, which movements are absorbed by the elastic foot which correspondingly deforms such that the majority of the amplitude of a vibration is absorbed by the deformation of the elastic foot and is not transferred to the local coil arrangement. The material properties of the foot are selected such that as optimal a decoupling as possible is achieved. For example, a Shore hardness of Shore 30A has proven to be advantageous.

The foot can appropriately be designed so that it can be exchanged. A defective foot, for example, can thus be easily replaced. A particular advantage results when the local coil arrangement has exchangeable feet with various material properties and/or various geometries, in particular various elasticity modules. An adaptation of the vibration response can then be achieved simply by exchanging the feet. For example, if the local coil arrangement has four connection devices, the four feet can altogether be replaced by four other similar feet, so a different characteristic damping curve is achieved. This is particularly advantageous when the local coil arrangement is used under different conditions, for example for acquisition of different body parts of a patient. In general, the necessary damping is dependent on the weight that the patient places on the local coil arrangement. Depending on which portion of the patient is positioned on the local coil arrangement, vibrations of the patient are also transferred to the supported body part, which in this case vibrates more with the coil. A slight or different damping is required.

In another embodiment a base plate of the local coil arrangement has cylindrical blind hole of a specific depth to accommodate a rotationally symmetrical, conically tapering foot. The length of the foot loaded only by the weight of the local coil arrangement is greater than the depth of the blind hole. A lateral deflection of the feet is realized in this manner, such that they cannot be sheared when a high weight lies on the base plate and a lateral force thereby develops. The damping path is additionally defined as being limited by this partial countersinking. It should be ensured, however, that a sufficient damping path is always provided. In such an embodiment the elastic foot deforms given a vibration in a lateral direction until its cone wall abuts the edge of the blind hole. Further shearing is thus barely possible, such that the feet are not excessively loaded. The durability of the elastic feet is thereby increased and the damping effect can be further adapted. The length of the feet can be 16 mm, for example, the depth of the blind hole can be 12 mm.

If a blind hole is provided, the foot (designed compressed) can be entirely countersunk in the blind hole given a specific weight acting on the local coil arrangement. In this case the special accommodation of the feet in the blind holes fulfills a further function in addition to the protection of the feet, namely a possible deactivation of the vibration damping device. This occurs when the elastic foot is compressed so far that its length corresponds to the depth of the blind hole; the foot is correspondingly accommodated by the blind hole. The local coil arrangement then lies on the patient bed, for example on a patient positioning plate or on mounting rails. The volume of the foot compressed in this manner corresponds to the volume of the blind hole. A deactivation of the vibration damping device can therefore already be reasonable since given a large weight acting on the local coil arrangement or the base plate it is to be assumed that vibrations of the patient are also to be found in the supported body part, and thus a damping of the local coil arrangement is no longer necessary since this vibrates identically with the patient. The weight with which the base plate is loaded thus ultimately forms a switching function for deactivation of the vibration damping device. However, it is not only an on-off effect that is achieved via the inventive embodiment; rather, the entire characteristic damping curve is dynamically adapted. Dependent on the weight acting on the elastic, compressible foot, its conical tapering shape widens, such that the damping path is reduced with increasing weight until the vibration damping effect is entirely deactivated. These damping properties can now be advantageously adapted such that, in principle, an ideal (or no) damping effect is always present depending on what portion of the patient is supported on the base plate. For further adaptation of the damping behavior, thus of the characteristic damping curve, it can be provided that every connection device possesses at least two adjacent feet of different lengths in two adjacent blind holes. A progressive damping is achieved in this manner, meaning that the local coil arrangement initially rests on only the longer feet. Given a specific weight the second, shorter foot is then added. Finally, given a further active force both feet are countersunk and the vibration damping device is deactivated.

To mount the foot in the blind hole it can be provided that the foot has a cylindrical region for mounting of the foot in the floor region of the blind hole based on friction and/or elastic forces. In this manner the feet can simply be inserted into the respective blind holes and also be quite simply extracted again, such that in particular their replacement is simplified.

According to the invention, the foot can be plastic, in particular an elastomer (for example). As already mentioned, a Shore hardness of Shore 30A has proven to be suitable.

In addition or as an alternative to the damping by means of an elastic (in particular compressible) foot, the vibration damping device can comprise at least one damping element actively controlled with counter-oscillations to damp a vibration. Such a damping element can, for example, be a piezoelectric element and/or a hydraulic or pneumatic element. Stacks of individual piezoelectric elements are also possible. An active damping is realized in this manner that can be operated via a look-ahead controller, for example. Naturally, it is likewise possible that a sensor is provided that interacts with a control device to form a feedback controller.

The vibrations (which lead to image artifacts) to be damped by means of such a vibration damping device lie in the range of over 5 Hz, such that vibrations in this range can advantageously be damped.

Nevertheless, in order to be able to limit a movement of the local coil arrangement in the longitudinal direction of the patient bed or, respectively, in lateral directions (meaning to achieve a positioning of the local coil arrangement), it can appropriately comprise a guidance device for positioning of the local coil arrangement. In an embodiment of the invention, the guidance device can thereby be designed such that the local coil arrangement comprises at least one guidance element for engaging in a guidance recess of the patient bed or at least one guidance recess for accommodation of a guidance element of the patient bed, wherein the guidance element is freely supported in an active vibration damping device. The guidance element is accordingly freely supported, meaning supported with a certain play in its movement. This can be realized via a corresponding exact placement of the local coil arrangement, such that the guidance element is located exactly in the recess; however, it can also be provided in that the guidance element is fashioned such that it can itself move within a specific range. The position of the local coil arrangement at a specific region is established in this manner.

The invention also concerns a patient bed for a magnetic resonance apparatus, having a number of supporting connection devices for accommodation of a local coil arrangement that is characterized in that each supporting connection device including a vibration damping device. This connection device (which is provided at the patient bed) can ultimately be designed like the local coil arrangement, such that the statements there analogously apply. The patient bed can accordingly have elastic feet projecting from it, on which feet the local coil arrangement is placed. These feet can be accommodated in blind holes in a bearing plate and/or mounting rails.

If a guidance device is provided, the guidance elements or the guidance recess can be arranged at a patient positioning plate, but also at lateral mounting rails of the patient bed, for example. For example, guidance recesses can be arranged at regular intervals (spacings) that enable the local coil arrangement to be placed at various positions.

The invention also concerns a magnetic resonance apparatus with a patient bed, wherein the patient bed is fashioned according to the invention, and/or the magnetic resonance apparatus has a local coil arrangement according to the present invention. If the connection devices are not provided at the patient bed, the patient bed is provided with the corresponding interacting parts, in particular the with the guidance element and/or the guidance recess.

With the inventive magnetic resonance apparatus it is possible to achieve a significantly improved image quality given acquisitions with local coils.

BRIEF DESCRIPTION OF THE DRAWINGS

FIG. 10 shows an inventive patient bed.

DESCRIPTION OF THE PREFERRED EMBODIMENTS

Figure 1:
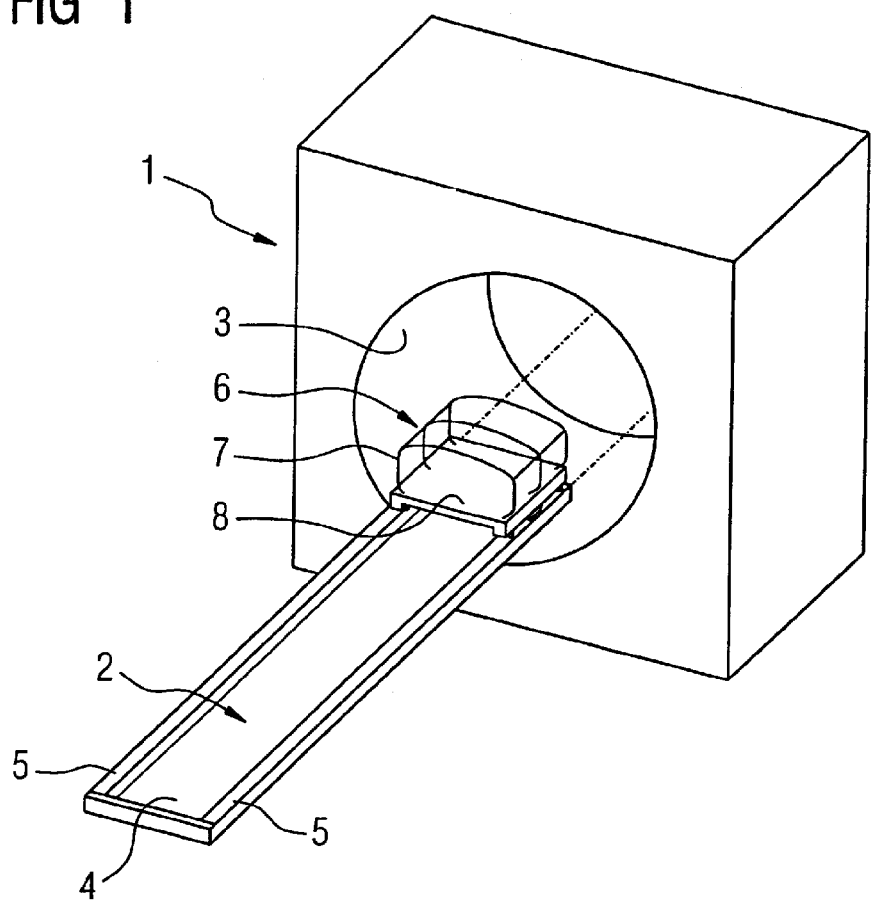
FIG. 1 illustrates an inventive magnetic resonance apparatus.

FIG. 1 shows an inventive magnetic resonance apparatus 1. A patient bed 2 can be moved into a patient recess 3. The patient bed 2 has a patient positioning plate 4 that is laterally bounded by a mounting rail 5 on each side.

A local coil arrangement 6 is placed on the patient bed 2, more precisely the mounting rails 5. The local coil arrangement 6 has a local coil 7 that is mounted on a base plate 8. The base plate 8 and/or the patient bed 2 has supporting connection devices that each comprise a vibration damping device that should decouple the local coil arrangement 6 from the patient bed 2.

Figure 2:
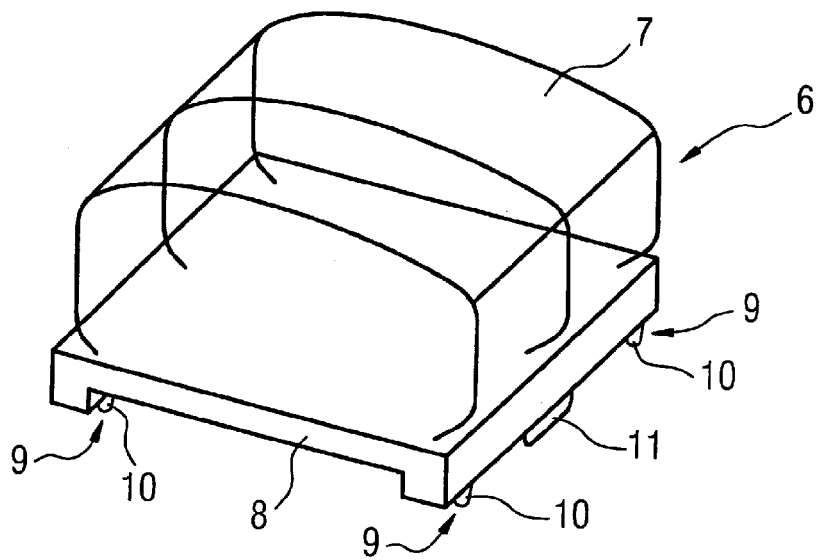
FIG. 2 shows an inventive local coil arrangement.

FIG. 2 shows an inventive local coil arrangement 6. As already mentioned, it comprises a base plate 8 on which one or more local coils 7 are attached. The base plate 8 is rectangular and possesses a connection device 9 at each of its corners. The connection device 9 has an elastic foot 10 that is partially countersunk into a blind hole (not shown in detail here). A guidance element 11 in the form of a guidance fin is additionally provided on each side, which guidance element 11 is provided to engage in corresponding guidance recesses on the patient bed 2, wherein the guidance element 11 is freely supported so that here no vibrations are transferred.

Figure 3:
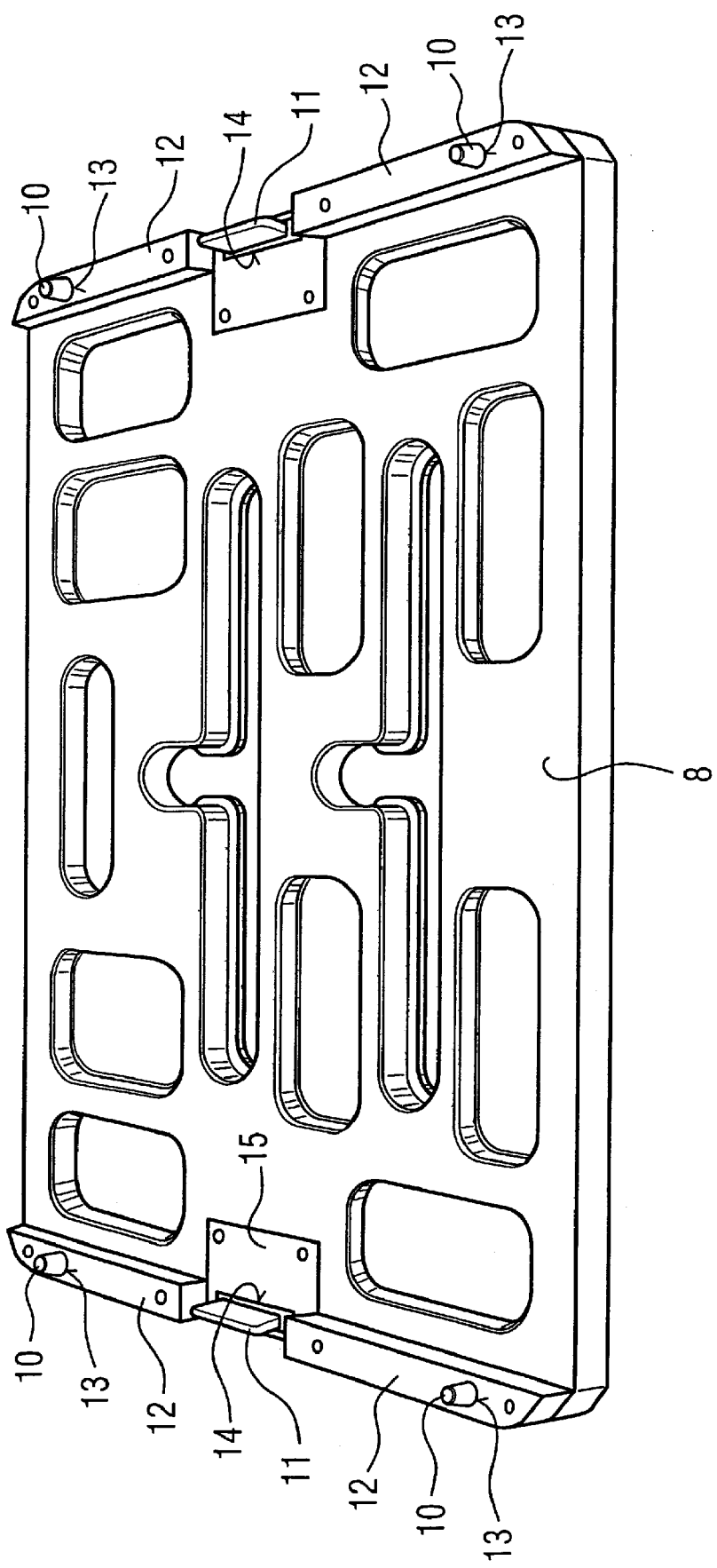
FIG. 3 is a view of the base plate of the local coil arrangement from below.

FIG. 3 shows the underside of the base plate 8 of the local coil arrangement 6. Laterally raised edges 12 are clearly provided in which cylindrical blind holes 13 are fashioned. Each of the cylindrical blind holes 13 accepts an elastic and compressible foot 10 via which vibrations can be damped. The foot 10 additionally bears the mounted local coil arrangement 6.

Guidance elements 11 (that here are fashioned as guidance fins) are likewise attached at the sides in the plane of the base plate 8 such that they can move. The guidance elements 11 are shaped parts with a perpendicular base (not visible here) that is fashioned greater than a slot 14 in a retention plate 15 below which the base of the guide element 11 can be displaced. The slot 14 defines the movement play of the guidance element 11.

Figure 4:
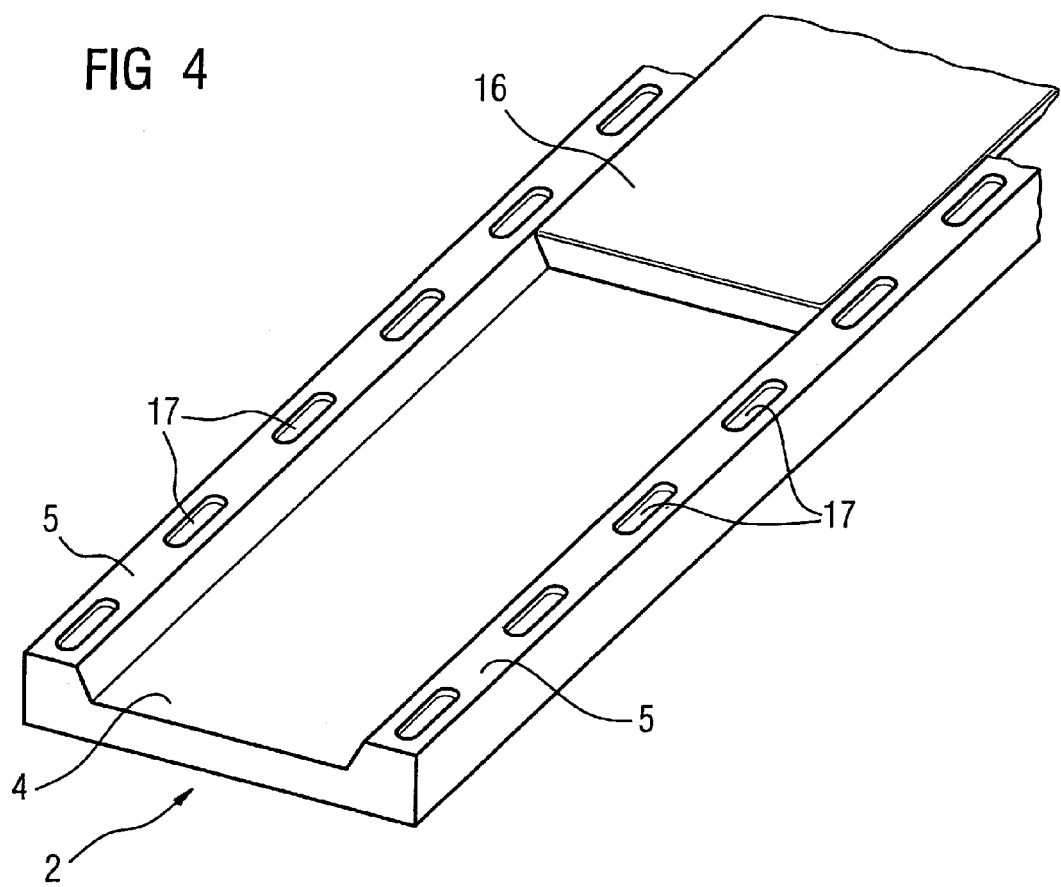
FIG. 4 shows an embodiment of the patient bed for accommodation of the local coil arrangement.

FIG. 4 shows the patient bed 2 on which the local coil arrangement 6 can be placed. As already mentioned, the patient bed 2 has lateral mounting rails 5. The actual patient positioning plate 4 is provided between the mounting rails 5. The patient positioning plate 4 is recessed so that a cushioning 16 can be used. The mounting rails 5 possess recesses 17 at regular intervals, which recesses 17 are designed to accommodate the guidance elements 11. These are fashioned somewhat larger in their cross-section than the cross-section of the guidance elements 11. To place the local coil arrangement 6 on the patient bed 2, the guidance elements 11 are subsequently brought into engagement with two opposing recesses 17 and the elastic and compressible feet 10 are placed on the surface of the mounting rail 5. For this the arrangement of the feet 10 and the guidance elements 11 is naturally selected such that the feet 10 touch down in a region of the mounting rail 5 in which no recess 17 is present. The guidance elements 11 are freely supported in the recesses 17 in the mounted state of the local coil arrangement 6. This is enabled due to the difference of the cross-section size and the movable bearing of the guidance elements 11.

Figure 5:
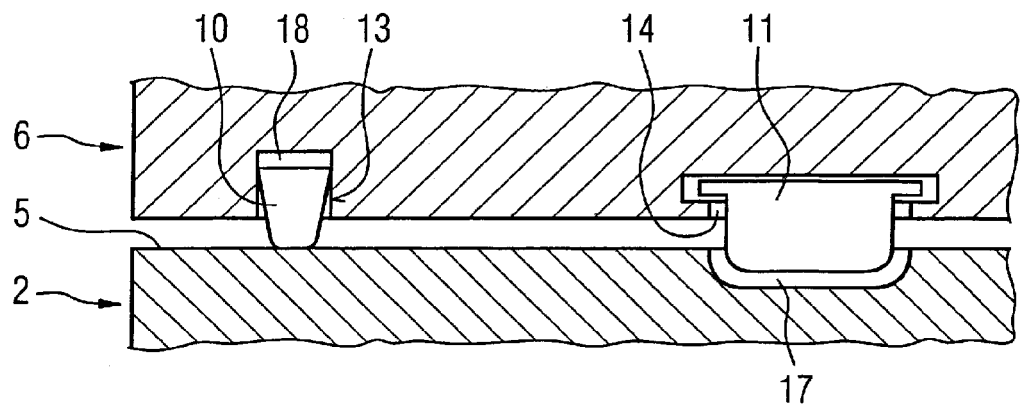
FIG. 5 is a section through a part of the placed local coil arrangement.

FIG. 5 shows a cross-section through the local coil arrangement 6 placed on the patient bed 2. The elastic and compressible foot 10 (which exhibits a Shore hardness of A30) is clearly arranged in the blind hole 13, wherein the foot 10 is longer than the blind hole 13 is deep. The foot 10 exhibits a cylindrical region 18 whose cross-section measurements essentially correspond to those of the blind hole 13, such that the foot 10 is held in the blind hole 13 by the region 18 and friction. If the cross-sectional area of the region 18 is somewhat greater than that of the cylindrical blind hole 13, elastic retention forces appear. In addition to this the foot 10 is designed such that it can be exchanged, meaning that a defective foot 10 or a foot 10 that is otherwise to be replaced can simply be pulled out from the blind hole 13 and a new foot 10 can be inserted. The local coil arrangement 6 advantageously has further sets of (respectively) four feet 10 designed for exchange, the feet 10 exhibiting different material properties and/or different geometries. By exchanging a set of feet for another set of feet, the damping properties can accordingly be modified as desired without changing other components.

The foot 10 tapers conically below the cylindrical region 18, with its tip on the mounting rail 5 of the patient bed 2. At the same time the guidance element 11 engages in a self-supporting manner in the recess 17. The guidance element 11 is received in a recess 14 in the local coil arrangement 6, and does not contact the recess 17 in the patient bed 2, and in particular does not bear the local coil arrangement 6, such that no vibrations whatsoever can be transferred here. Nevertheless, the guidance device with the guidance element 11 and the recess 17 sufficiently defines the position of the local coil arrangement 6 on the patient bed 2.

Figure 6:
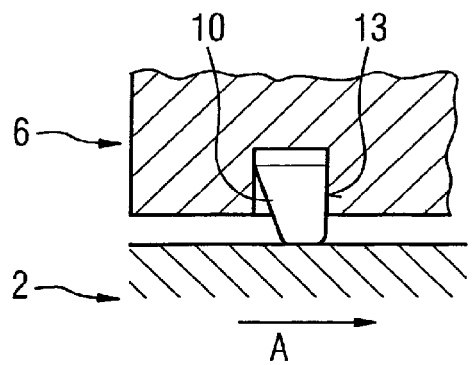
FIGS. 6-8 are partial sections through the placed local coil arrangement in various operating states.
Figure 7:
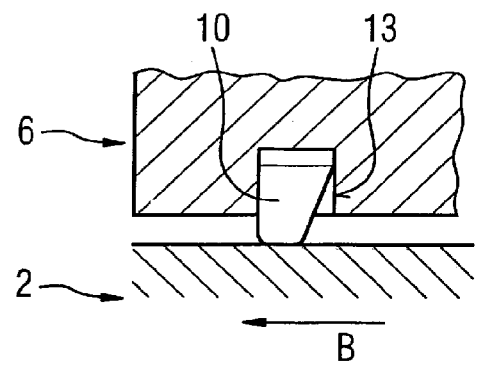

FIGS. 6 and 7 show the functional principle of the damping by the elastic foot in turn in a partial cross-section through the placed local coil arrangement 6. In FIG. 6 the patient bed 2 vibrates in the direction of the arrow A and accordingly carries the elastic foot 10 with it until the surface of its conical region contacts the edge of the blind hole 13. Until this position the movements of the patient bed 2 are thus not transferred to the local coil arrangement 6. The embodiment of the elastic foot 10 thus allows the determination of a defined, maximum possible damping path at a defined load of the local coil arrangement 6 by a weight. This defined damping path should be dimensioned such that vibrations causing the vibration artifacts can be damped. In addition to this, the foot 10 is protected from excessive shearing (and therewith damage) by the partial countersinking in the blind hole 13, since the blind hole 13 forms a guide for the foot 10.

FIG. 7 shows the same section as FIG. 6 given a forward swing indicated by the arrow B. The movement play of the guidance element 11 can moreover be adapted to this defined damping path.

Figure 8:
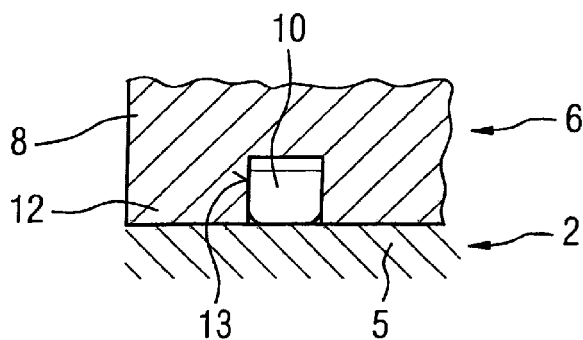

FIG. 8 shows the section from FIG. 6 and FIG. 7 in a case in which the base plate 8 of the coil arrangement 6 is loaded beyond a threshold. As already mentioned, the elastic foot 10 is also compressible, such that it is completely accommodated by the blind hole 13 upon exceeding the threshold. The volume of the blind hole 13 and of the compressed foot 10 is thereby selected such that the foot 10 is entirely accommodated.

In the state shown in FIG. 8 the base plate 8 or its edge 12 accordingly rests on the mounting rail 5 of the patient bed 2 such that the damping is automatically deactivated. The feet 10 thus fulfill a switching function that is realized across various loads of the local coil arrangement 6 or the base plate 8. In intermediate states (not shown in detail here), the foot 10 is also partially compressed, such that the radius increases in the conical region and thus the damping path is reduced. A characteristic damping curve is accordingly provided that is weight-dependent and thus can be precisely adapted to the necessary behavior.

Figure 9:
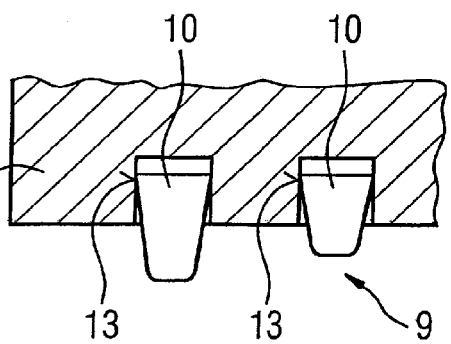
FIG. 9 shows an embodiment of a connection device with two feet arranged next to one another.

FIG. 9 shows a further embodiment of the adjustment of the damping behavior. Two adjacent blind holes 13 are provided in the base plate 8 at each of the connections 9. Feet 10 of different lengths are arranged in the blind holes 13, such that initially only the left foot 10 rests on the patient bed 2. The right foot 10 is added to this as of a specific weight. A progressive damping is realized in this manner, such that the characteristic damping curve can be further adapted.

Such a control of the damping properties is both advantageous and appropriate since the necessary damping correlates with the weight on the local coil arrangement 6. If a larger portion of the patient is located on the local coil arrangement 6, the corresponding body part is less damped relative to the patient, such that a coherent resonance arises with increasing load, which makes a deactivation of the damping reasonable as of the threshold. A shorter damping path is required given greater load. A decoupling adapted to the actual requirements that provides for an optimal image quality can thus be achieved in the inventive magnetic resonance apparatus or with the inventive local coil arrangement 6 or patient bed 2' (see FIG. 10).

Additionally or alternatively, the connections 9 (here thus the feet 10 arranged in the blind holes 13) can also be arranged on the patient bed. A corresponding example for an inventive patient bed 2' is shown in FIG. 10. Recesses 17 are provided in turn at regular intervals, between which recesses 17 connection devices 9 are likewise provided at regular intervals in the form of elastic and compressible feet 10 that are partially countersunk in blind holes.

In addition to the passive damping by the elastic and compressible feet 10, an active damping (not shown in detail in Figures) can also be provided by an active damping element that can be controlled with counter-vibrations to damp a vibration, wherein the damping element can be a piezoelectric element or even a hydraulic or pneumatic element. It is also possible here to use a sensor that allows a feedback control.

The embodiment of the guidance device can also be effected in a different manner. In a simple variation, the guidance elements 11 can also be provided at the patient bed 2, wherein the recesses 17 are then provided at the local coil arrangement 6. Other embodiments are also possible as long as a system that is self-supporting up to the connection devices 9 is achieved.

Although modifications and changes may be suggested by those skilled in the art, it is the intention of the inventors to embody within the patent warranted hereon all changes and modifications as reasonably and properly come within the scope of their contribution to the art.

We claim as our invention:

1. A local coil arrangement configured for magnetic resonance imaging, comprising:

an electrical conductor arrangement configured to form a local coil for at least receiving magnetic resonance signals;

a base body having a first side at which said conductor arrangement is mounted, said base body having a second side opposite said first side; and a plurality of supporting connection devices projecting from said second side of said base body, said supporting connection devices being configured to mount said base body and said conductor arrangement on a patient bed of a magnetic resonance apparatus at locations susceptible to imparting vibrations from said patient bed through said base body to said conductor arrangement, each of said supporting connection devices being composed of vibration-damping material and forming a vibration damper that attenuates said imparted vibrations.

2. A local coil arrangement as claimed in claim 1 wherein each of said supporting connection devices comprises an elastic foot projecting from said second side of said base body.

3. A local coil arrangement as claimed in claim 2 wherein each elastic foot is removably attached to said second side of said base body.

4. A local coil arrangement as claimed in claim 3 comprising a set of groups of elastic feet, the respective groups of elastic feet having different characteristics that affect attenuation of said vibrations, said groups of elastic feet being selectively attachable to said second side of said base body in order to produce a selected attenuation of said vibrations.

5. A local coil arrangement as claimed in claim 2 wherein said conductor configuration and said base body, in combination, exhibit a weight, and wherein each elastic foot has a rotationally symmetrical, conically tapering configuration, and wherein said base body comprises, for each elastic foot, a cylindrical blind hole having a depth, with a length of each elastic foot, when loaded only by said weight, being greater than said depth.

6. A local coil arrangement as claimed in claim 5 wherein said configuration of each elastic foot allows each elastic foot to be completely countersunk into said blind hole configured for a predetermined value of said weight.

7. A local coil arrangement as claimed in claim 5 wherein each supporting connecting device comprises two adjacent elastic feet having respectively different lengths.

8. A local coil arrangement as claimed in claim 5 wherein each blind hole has a hole base in said base body, and wherein each elastic foot comprises a cylindrical region, adjacent said hole base, that maintains that elastic foot in that blind hole by friction or compression.

9. A local coil arrangement as claimed in claim 2 wherein each elastic foot is comprised of elastomeric plastic.

10. A local coil arrangement as claimed in claim 1 wherein each supporting connection device forms an actively controllable vibration damping element, as said vibration damper, that is controlled in order to produce counter-vibrations that dampen said vibrations.

11. A local coil arrangement as claimed in claim 10 wherein each actively controllable damping element is formed by at least one of a piezoelectric element, a hydraulic element, and a pneumatic element.

12. A local coil arrangement as claimed in claim 10 wherein each actively controllable damping element is operable in order to attenuate vibrations above 5 Hz.

13. A local coil arrangement as claimed in claim 1 comprising a guidance device carried by said base body configured to assist in positioning said base body on said patient bed.

14. A local coil arrangement as claimed in claim 13 wherein said guidance device is selected from the group consisting of at least one guidance element configured to engage a guidance recess of the patient bed, and at least one guidance recess configured to accept a guidance element of the patient bed.

15. A local coil arrangement as claimed in claim 14 wherein each supporting connection device forms an actively controllable vibration damping element, as said vibration damper, that is controlled in order to produce counter-vibrations that dampen said vibrations, and wherein said guidance device is freely supported in said actively controllable damping element.

16. A patient bed configured for a magnetic resonance apparatus, comprising:
a bed surface configured as a patient's supporting surface to receive a patient thereon during a magnetic resonance imaging examination making use of a local coil arrangement; and
a plurality of supporting connection devices adjacent said patient supporting surface that support and hold said local coil arrangement at said surface at locations susceptible to imparting vibrations from said patient support surface to said local coil arrangement, and each of said supporting connection devices being composed of a vibration damping material and forming a vibration damper that attenuates said imparted vibrations.

17. A patient bed as claimed in claim 16 wherein each of said supporting connection devices comprises an elastic foot.

18. A patient bed as claimed in claim 17 wherein each elastic foot is removably attached to said local coil arrangement.

19. A patient bed as claimed in claim 18 comprising a set of groups of elastic feet, the respective groups of elastic feet having different characteristics that affect attenuation of said vibrations, said groups of elastic feet being selectively attachable to said local coil arrangement in order to produce a selected attenuation of said vibrations.

20. A patient bed as claimed in claim 17 wherein said conductor configuration has a weight, and wherein each elastic foot has a rotationally symmetrical, conically tapering configuration, and wherein said local coil arrangement, comprises, for each elastic foot, a cylindrical blind hole having a depth, with a length of each elastic foot, when loaded only by said weight, being greater than said depth.

21. A patient bed as claimed in claim 20 wherein said configuration of each elastic foot allows each elastic foot to be completely countersunk into said blind hole configured for a predetermined value of said weight.

22. A patient bed as claimed in claim 20 wherein each supporting connecting device comprises two adjacent elastic feet having respectively different lengths.

23. A patient bed as claimed in claim 20 wherein each blind hole has a hole base in said local coil arrangement, and wherein each elastic foot comprises a cylindrical region, adjacent said hole base, that maintains that elastic foot in that blind hole by friction or compression.

24. A patient bed as claimed in claim 17 wherein each elastic foot is comprised of elastomeric plastic.

25. A patient bed as claimed in claim 16 wherein each supporting connection device forms an actively controllable vibration damping element, as said vibration damper, that is controlled in order to produce counter-vibrations that dampen said vibrations.

26. A patient bed as claimed in claim 25 wherein each actively controllable damping element is formed by at least one of a piezoelectric element, a hydraulic element, and a pneumatic element.

27. A patient bed as claimed in claim 25 wherein each actively controllable damping element is operable in order to attenuate vibrations above 5 Hz.

28. A patient bed as claimed in claim 16 comprising a guidance device carried by said local coil arrangement configured to assist in positioning said base body on said patient bed.

29. A patient bed as claimed in claim 28 wherein said guidance device is selected from the group consisting of at least one guidance element configured to engage a guidance recess of the patient bed, and at least one guidance recess configured to accept a guidance element of the patient bed.

30. A patient bed as claimed in claim 29 wherein each supporting connection device forms an actively controllable vibration damping element, as said vibration damper, that is controlled in order to produce counter-vibrations that dampen said vibrations, and wherein said guidance device is freely supported in said actively controllable damping element.

31. A magnetic resonance apparatus comprising:
a magnetic resonance data acquisition device comprising
a patient bed configured to receive an examination subject thereon, and
a local coil arrangement selectively positionable on said patient bed in order to at least receive magnetic resonance signals from the subject, said patient bed being susceptible to imparting vibrations to said local coil arrangement; and
a plurality of supporting connection devices disposed between said local coil arrangement and said patient bed and holding and supporting said local coil arrangement on said patient bed at locations susceptible to imparting said vibrations to said local coil arrangement from said patient bed, and each supporting connection device being composed of a vibration damping material and forming a vibration damper that attenuates said imparted vibrations.

* * * * *